US010816276B2

(12) United States Patent
Aoki et al.

(10) Patent No.: US 10,816,276 B2
(45) Date of Patent: Oct. 27, 2020

(54) HEAT PIPE

(71) Applicant: Furukawa Electric Co., Ltd., Tokyo (JP)

(72) Inventors: Hirofumi Aoki, Tokyo (JP); Hiroshi Sakai, Tokyo (JP); Yoshikatsu Inagaki, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 60 days.

(21) Appl. No.: 16/080,647

(22) PCT Filed: Feb. 24, 2017

(86) PCT No.: PCT/JP2017/006981
§ 371 (c)(1),
(2) Date: Aug. 28, 2018

(87) PCT Pub. No.: WO2017/150356
PCT Pub. Date: Sep. 8, 2017

(65) Prior Publication Data
US 2019/0024984 A1 Jan. 24, 2019

(30) Foreign Application Priority Data

Feb. 29, 2016 (JP) .................................. 2016-037705

(51) Int. Cl.
*F28D 15/04* (2006.01)
*F28F 21/08* (2006.01)
(Continued)

(52) U.S. Cl.
CPC .............. *F28D 15/046* (2013.01); *C01B 3/00* (2013.01); *C01B 3/0031* (2013.01); *F28D 15/04* (2013.01);
(Continued)

(58) Field of Classification Search
CPC ..... F28D 15/046; F28D 15/04; C01B 3/0031; F28F 21/083; F28F 21/089; F28F 2275/06
See application file for complete search history.

(56) References Cited

U.S. PATENT DOCUMENTS 3,461,917 A * 8/1969 Uto ...................... B23K 9/0026
138/143
6,471,795 B2 * 10/2002 Kubo ...................... C22C 22/00
148/538
(Continued)

FOREIGN PATENT DOCUMENTS

JP S61001993 A 1/1986
JP S61008595 A 1/1986
(Continued)

OTHER PUBLICATIONS

International Search Report and Written Opinion dated Apr. 21, 2017 for PCT Application PCT/JP2017/006981, 12 pages (Engl. Translation of ISR).
(Continued)

*Primary Examiner* — Jon T. Schermerhorn, Jr.
(74) *Attorney, Agent, or Firm* — Dorsey & Whitney LLP

(57) ABSTRACT

To provide a heat pipe where the heat pipe has an excellent capacity for absorbing a non-condensable gas such as a hydrogen gas thus exhibiting excellent heat transfer characteristics.
The heat pipe includes: a container having a cavity portion inside the container; a wick structure disposed in the cavity portion; a working fluid sealed in the cavity portion; and a metal which absorbs hydrogen at 350° C. or below and releases no hydrogen at 350° C. or below, the metal being disposed in the cavity portion.

9 Claims, 8 Drawing Sheets

(51) Int. Cl.
*C01B 3/00* (2006.01)
*H01L 23/427* (2006.01)
*F28F 13/00* (2006.01)
*H05K 7/20* (2006.01)
*B23K 101/14* (2006.01)

(52) U.S. Cl.
CPC .............. *F28F 13/00* (2013.01); *F28F 21/08* (2013.01); *F28F 21/083* (2013.01); *H01L 23/427* (2013.01); *H05K 7/20336* (2013.01); *B23K 2101/14* (2018.08); *C01B 3/0026* (2013.01); *F28F 2275/06* (2013.01)

(56) References Cited

U.S. PATENT DOCUMENTS

| 8,288,946 | B2 * | 10/2012 | Matsushima | H01J 61/26 313/561 |
| 2007/0068605 | A1 * | 3/2007 | Statnikov | C21D 10/00 148/558 |
| 2018/0372418 | A1 * | 12/2018 | Chiang | F28D 15/04 |

FOREIGN PATENT DOCUMENTS

| JP | S61180887 U | 8/1986 |
| JP | H03501998 A | 5/1991 |
| JP | 2002062070 A | 2/2002 |
| JP | 2005154204 A | 6/2005 |
| JP | 2005214565 A | 8/2005 |
| JP | 2010060206 A | 3/2010 |
| WO | 90/04748 | 5/1990 |

OTHER PUBLICATIONS

English Translation of International Preliminary Report on Patentability Chapter I in PCT Application No. PCT/JP2017/006981, dated Sep. 4, 2018.

English Translation of the Written Opinion of the International Search Authority in PCT Application PCT/JP2017/006981, dated May 9, 2017; 11 pages.

English Translation of Corresponding CN Application No. 201790000633.X 1st OA dated Apr. 26, 2019.

English Translation of Decision to Grant a Patent received in JP application No. 2018-503095 dated Sep. 17, 2019.

English Translation of Notification to Grant Utility Model Patent Right in Chinese Utility Model application No. 201790000633.X dated Aug. 9, 2019.

English translation of Notification of Reasons for Refusal received in JP Application No. 2018-503095 dated Jun. 17, 2019.

* cited by examiner

HEAT PIPE

RELATED APPLICATIONS

This application is a U.S. National Stage filing under 35 U.S.C. § 371 of PCT Application No. PCT/JP2017/006981, filed Feb. 24, 2017 which claims priority to Japanese Application No. 2016/037705 filed Feb. 29, 2016, which, are incorporated herein by reference in their entirety, for any purpose.

TECHNICAL FIELD

The present invention relates to a heat pipe where a non-condensable gas such as a hydrogen gas which is present in the inside of a container is reduced so that the heat pipe exhibits excellent heat transfer characteristics.

BACKGROUND ART

An electric device, an electronic device and an electronic component such as a semiconductor element mounted on a vehicle or the like increase in amount of heat generation due to enhanced functions and high-density mounting or the like caused by size reduction. Accordingly, in recent years, it is considered important to cool these devices. A heat pipe may be used as a method for cooling an electronic component.

From a viewpoint of mechanical strength and the like and compatibility with a working fluid, a material such as copper, a copper alloy, iron, an iron alloy, stainless steel, aluminum, an aluminum alloy, nickel, or a nickel alloy (for example, Inconel (registered trademark)), for example is used for forming a container of a heat pipe. However, due to compatibility between the container and the working fluid and mixing of impurities into the inside of the container, there may be a case where the container and the working fluid react with each other thus generating a non-condensable gas such as a hydrogen gas. When a non-condensable gas such as a hydrogen gas is present in the inside of the container, the non-condensable gas does not contribute to heat transfer which uses latent heat, and deteriorates a vacuum state in the inside of the container. Accordingly, there is a problem that heat transfer characteristic of the heat pipe is lowered.

In view of the above, a heat pipe is proposed where a hydrogen gas removal member which contains metal such as a cupric oxide is disposed at a condensation portion so as to remove a hydrogen gas generated due to the chemical reaction between a working fluid and a container, and the hydrogen gas removal member is fitted in an inner wall surface of the condensation portion at a plurality of portions in a contact manner (Patent Document 1).

However, in the technique disclosed in Patent Document 1 where the hydrogen gas removal members are fitted in the container, hydrogen is removed by making use of the oxidation-reduction reaction of a metal oxide so that a front surface of the metal oxide mainly contributes to the reaction. Accordingly, there are problems such as a problem where the heat pipe does not exhibit a sufficient capacity for removing a hydrogen gas, and a problem where the hydrogen gas removal member is reduced so that ions of metal such as copper, lead, or barium are dissolved into the working fluid whereby reliability is lowered.

DOCUMENT LIST

Patent Document

Patent Document 1: Japanese Laid-Open Patent Publication No. 2010-60206

SUMMARY OF INVENTION

Technical Problem

The present invention has been made in view of the above-mentioned circumstances, and it is an object of the present invention to provide a heat pipe where the heat pipe has an excellent capacity for absorbing a non-condensable gas such as a hydrogen gas thus exhibiting excellent heat transfer characteristics.

Solution to Problem

An aspect of the present invention is directed to a heat pipe which includes: a container having a cavity portion inside the container; a wick structure disposed in the cavity portion; a working fluid sealed in the cavity portion; and a metal which absorbs hydrogen at 350° C. or below and releases no hydrogen at 350° C. or below, the metal being disposed in the cavity portion.

An aspect of the present invention is directed to the heat pipe where a material for forming the container is copper, a copper alloy, iron, an iron alloy, stainless steel, aluminum, an aluminum alloy, nickel, or a nickel alloy (for example, Inconel (registered trademark)).

An aspect of the present invention is directed to the heat pipe where a material for forming the container is stainless steel.

An aspect of the present invention is directed to the heat pipe where the metal is a titanium-based alloy, a palladium-based alloy, a vanadium-based alloy, a calcium-based alloy or a composite alloy of the titanium-based alloy, the palladium-based alloy, the vanadium-based alloy, and the calcium-based alloy.

An aspect of the present invention is directed to the heat pipe where the metal is a titanium-based alloy.

An aspect of the present invention is directed to the heat pipe where the metal is arranged at a portion where the working fluid is condensed.

An aspect of the present invention is directed to the heat pipe where the metal is fixed to the container or the wick structure by welding, and an alloy portion is formed between the metal and the container or between the metal and the wick structure.

In the above-mentioned aspect, the metal is fixed to an inner surface of the container or an inner surface of the wick structure by welding. The metal is welded to the container or the wick structure thus forming the alloy portion which contains a component of the metal and a component of the container or a component of the wick structure.

An aspect of the present invention is directed to the heat pipe where the alloy portion contains any of iron, nickel, chromium or the metal.

An aspect of the present invention is directed to the heat pipe where the alloy portion is formed of 2 mass % to 50 mass % of the metal.

In the above-mentioned aspect, a portion of the metal disposed in the inside of the container is welded, and 2 mass % to 50 mass % of the metal forms the alloy portion in cooperation with the container or the wick structure.

An aspect of the present invention is directed to the heat pipe where an amount of hydrogen gas in the cavity portion is 10 volume % or less of an entire amount of gas in the cavity portion at an operation temperature of 50° C.

An aspect of the present invention is directed to a heat sink which includes the above-mentioned heat pipe.

Effects of Invention

According to the aspect of the present invention, the metal which absorbs hydrogen at 350° C. or below and releases no hydrogen at 350° C. or below is disposed in the cavity portion so that the metal absorbs a non-condensable gas such as a hydrogen gas. Accordingly, it is possible to acquire a heat pipe which exhibits excellent heat transfer characteristics for a long period of time.

A use environmental temperature of a heat pipe is generally 100° C. or below. However, the heat pipe may reach a temperature close to 300° C. in processing such as soldering or welding in a step of manufacturing the heat pipe. According to the aspect of the present invention where the metal which absorbs hydrogen at 350° C. or below and releases no hydrogen at 350° C. or below is disposed, even when a non-condensable gas such as a hydrogen gas is generated in the above-mentioned processing step, it is possible to prevent the non-condensable gas such as a hydrogen gas from being released to the cavity portion.

According to the aspect of the present invention, the metal which absorbs hydrogen at 350° C. or below and releases no hydrogen at 350° C. or below is welded to the container or the wick structure thus forming the alloy portion. Accordingly, the above-mentioned metal can enhance a capacity for absorbing a non-condensable gas such as a hydrogen gas and hence, it is possible to acquire a heat pipe which exhibits more excellent heat transfer characteristics.

According to the aspect of the present invention, 2 mass % to 50 mass % of the above-mentioned metal forms the alloy portion in cooperation with the container or the wick structure. Accordingly, the above-mentioned metal can further enhance a capacity for absorbing a non-condensable gas such as a hydrogen gas.

DESCRIPTION OF THE EMBODIMENTS

Hereinafter, a heat pipe according to a first embodiment of the present invention is described with reference to drawings.

Figure 1:
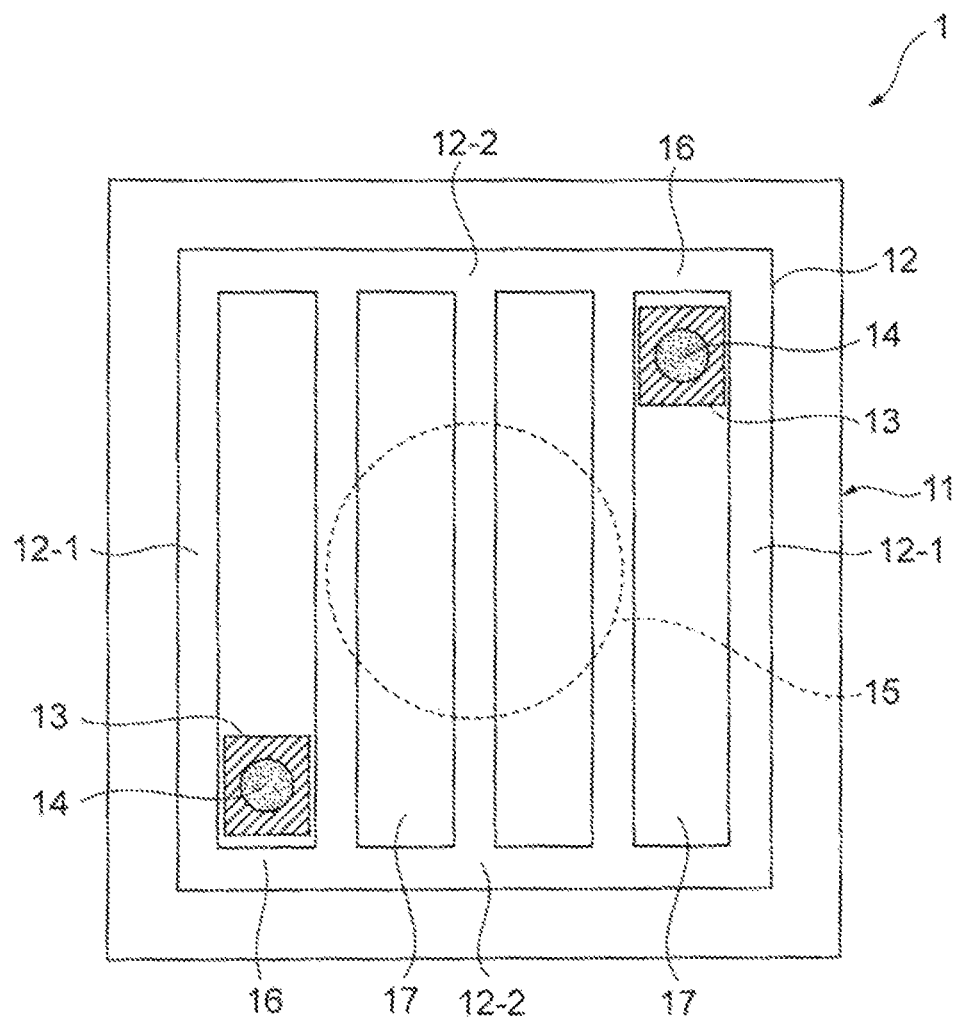
FIG. 1 is an explanatory view of the inside of a heat pipe according to a first embodiment of the present invention.

As shown in FIG. 1, the heat pipe 1 according to the first embodiment includes: a planar container 11 having a cavity portion in the inside thereof; a working fluid (not shown in the drawing) sealed in the cavity portion of the planar container 11; and a wick structure 12 disposed in the cavity portion of the planar container 11. Further, metals 13 are disposed in the cavity portion of the planar container 11, and the metals 13 absorb hydrogen at 350° C. or below and release no hydrogen at 350° C. or below.

With respect to the metal 13 which absorbs hydrogen at 350° C. or below and releases no hydrogen at 350° C. or below (hereinafter may be referred to as "hydrogen absorbing metal"), a portion where the hydrogen absorbing metal 13 is arranged and the number of hydrogen absorbing metals 13 arranged are not particularly limited. In the heat pipe 1, a plurality (two in the drawing) of hydrogen absorbing metals 13 are arranged at portions of a peripheral edge portion of the planar container 11 where the wick structure 12 is not arranged. Further, the hydrogen absorbing metals 13 are welded to an inner surface of the planar container 11 thus being fixed to the planar container 11. Moreover, the hydrogen absorbing metals 13 are welded to the inner surface of the planar container 11 so that alloy portions 14, each of which contains a component of the hydrogen absorbing metal 13 and a component of the planar container 11, are formed on the inner surface of the planar container 11 and inner surfaces of the hydrogen absorbing metals 13. Although not particularly limited, in the heat pipe 1, a welded portion of the hydrogen absorbing metal 13 is formed such that welding is performed at one portion, that is, at a center portion, of each hydrogen absorbing metal 13. Accordingly, in the heat pipe 1, the alloy portion 14 is formed at one portion, that is, at the center portion, of each hydrogen absorbing metal 13.

The alloy portion 14 is a portion where the planar container 11 and the hydrogen absorbing metal 13 are melted thus integrally formed with each other. On the other hand, portions of the hydrogen absorbing metal 13 which do not contribute to the formation of the alloy portion 14 remain the original component of the hydrogen absorbing metal 13.

As described above, in this mode, both the alloy portion 14 and the portions of the hydrogen absorbing metal 13 which do not contribute to the formation of the alloy portion 14 are arranged on the inner surface of the planar container 11 in a state of being exposed to the cavity portion of the planar container 11. Accordingly, both portions are brought into direct contact with the working fluid.

With respect to the hydrogen absorbing metal 13 arranged in the inside of the planar container 11, a ratio of a portion of the hydrogen absorbing metal 13 which forms the alloy portion 14 in cooperation with the planar container 11 is not particularly limited. However, it is preferable to set a lower limit value of the ratio to 2 mass % from a viewpoint of smoothly introducing hydrogen into portions of the hydrogen absorbing metal 13 which do not form the alloy portion 14. It is more preferable to set the lower limit value of the ratio to 5 mass % from a viewpoint of rapidly and reliably capturing a generated hydrogen gas, and it is preferable to set the lower limit value of the ratio particularly to 8 mass %. On the other hand, with respect to the hydrogen absorbing metal 13 disposed in the inside of the planar container 11, it is preferable to set an upper limit value of a ratio of a portion of the hydrogen absorbing metal 13 which forms the alloy portion 14 in cooperation with the planar container 11 to 50 mass % from a viewpoint of reliably preventing lowering of hydrogen absorbing capacity at 350° C. or below. It is more preferable to set the upper limit value to 40 mass % from a viewpoint of acquiring excellent hydrogen absorbing capacity at 350° C. or below, and it is preferable to set the upper limit value particularly to 30 mass %.

Although a material for forming the hydrogen absorbing metal 13 is not particularly limited, for example, a titanium-alloy-based material, a palladium-alloy-based material, a vanadium-alloy-based material, a calcium-alloy-based material, a composite material of these materials or the like can be named.

In the planar container 11, a heating element (not shown in the drawing) is thermally connected to a portion of the planar container 11 at a desired position so that the portion at the position functions as an evaporation portion. Further, in the planar container 11, a heat exchange means (not shown in the drawing) such as a heat radiating fin is thermally connected to a portion of the planar container 11 at a desired position different from the evaporation portion so that the portion at the position functions as a condensation portion. In FIG. 1, as an example of a use mode, a center portion of the planar container 11 is assumed as an evaporation portion 15, two corner portions of the peripheral edge portion of the planar container 11 are assumed as condensation portions 16, and the hydrogen absorbing metal 13 and the alloy portion 14 are arranged at each condensation portion 16.

A working fluid in a liquid phase which receives heat from the heating element changes phase from a liquid phase to a gas phase at the evaporation portion 15. The working fluid in a gas phase flows from the evaporation portion 15 to the condensation portion 16 thus transferring heat transmitted from the heating element to the working fluid to the condensation portion 16. The working fluid in a gas phase changes phase to a liquid phase at the condensation portion 16 thus releasing latent heat. At the same time, the working fluid in a liquid phase is refluxed from the condensation portion 16 to the evaporation portion 15 by a capillary force of the wick structure 12. On the other hand, a non-condensable gas such as a hydrogen gas is not condensed even at the condensation portion 16, and is present in a gas phase. Accordingly, a non-condensable gas has a tendency of stagnation at the condensation portion 16 without being refluxed from the condensation portion 16 to the evaporation portion 15. Accordingly, as described above, although a portion where the hydrogen absorbing metal 13 and the alloy portion 14 are arranged is not particularly limited, from a viewpoint of efficiently absorbing a non-condensable gas such as a hydrogen gas, it is preferable to arrange the hydrogen absorbing metal 13 and the alloy portion 14 at least at a portion of the condensation portion 16.

A size of the planar container 11 can be suitably selected according to a use state. For example, a size can be named where a size as viewed in a plan view is 10 mm to 100 mm×10 mm to 200 mm, and a thickness is 0.1 mm to 10 mm. Further, although a material for forming the planar container 11 is not particularly limited, for example, copper, a copper alloy, iron, an iron alloy, stainless steel, aluminum, an aluminum alloy, nickel, a nickel alloy (for example, Inconel (registered trademark)) or the like can be named.

As shown in FIG. 1, in the heat pipe 1, the wick structure 12 is disposed over the substantially entire region of the planar container 11 in the plane direction. Further, in this mode, the wick structure 12 is sandwich between a planar portion of the planar container 11 on the front surface side and a planar portion of the planar container 11 on the back surface side thus fixed in the planar container 11. A shape of the wick structure 12 as viewed in a plan view is not particularly limited. In the heat pipe 1, the wick structure 12 is formed into a ladder shape which includes a plurality of straight line portions 12-1 and two connecting portions 12-2 which are connected to end portions of the plurality of straight line portions 12-1. Further, gap portions formed between the straight line portions 12-1 of the wick structure 12 form vapor flow paths 17 which allow a working fluid in a gas phase to flow through from the evaporation portion 15 to the condensation portion 16.

Provided that the wick structure 12 has the structure which can generate a capillary force, the structure of the wick structure 12 is not particularly limited. For example, a metal mesh (a braided body formed of metal thin wires), a filament formed of metal thin wires, a sintered body of metal powder or the like can be named. Further, it may be possible to adopt the groove structure where a plurality of narrow grooves are formed on the inner surface of the planar container 11.

A material for forming the wick structure 12 can be suitably selected according to a use state. Copper, a copper alloy, iron, an iron alloy, stainless steel, aluminum, an aluminum alloy, nickel, a nickel alloy (for example, Inconel (registered trademark)) or the like can be named. Further, a material for forming the wick structure 12 may be or may not be equal to a material for forming the planar container 11.

The working fluid sealed in the cavity portion of the planar container 11 can be suitably selected according to compatibility with the material for forming the planar container 11 and the material for forming the wick structure 12. For example, water, alternative fluorocarbons, perfluorocarbon, cyclopentane or the like can be named.

In the heat pipe 1, at least a portion of the hydrogen absorbing metal 13 forms the alloy portion 14 in cooperation with the planar container 11. With such a configuration, the hydrogen absorbing metal 13 can enhance a capacity for absorbing hydrogen at 350° C. or below and releasing no hydrogen at 350° C. or below, that is, a capacity for absorbing hydrogen at 350° C. or below. Accordingly, it is possible to prevent that a non-condensable gas such as a hydrogen gas stagnates in the cavity portion of the planar container 11 thus deteriorating a vacuum state. Accordingly, it is possible to acquire the heat pipe 1 having excellent heat transfer characteristics. Further, in the heat pipe 1, even when the heat pipe 1 reaches a temperature close to 300° C. due to processing such as soldering or welding in a step of manufacturing the heat pipe 1, the metals 13 which absorb hydrogen at 350° C. or below and release no hydrogen at 350° C. or below are disposed. Accordingly, even when a non-condensable gas such as a hydrogen gas is generated in the above-mentioned processing step, it is possible to prevent the non-condensable gas such as hydrogen gas from being released to the cavity portion. For this reason, even if the heat pipe 1 is manufactured through the above-mentioned processing step, it is possible to acquire the heat pipe 1 having excellent heat transfer characteristics.

Next, a heat pipe according to a second embodiment of the present invention is described with reference to drawings. Constitutional elements identical to the constitutional elements of the heat pipe according to the first embodiment are given the same reference characters, and the description is made using the same reference characters.

Figure 2:
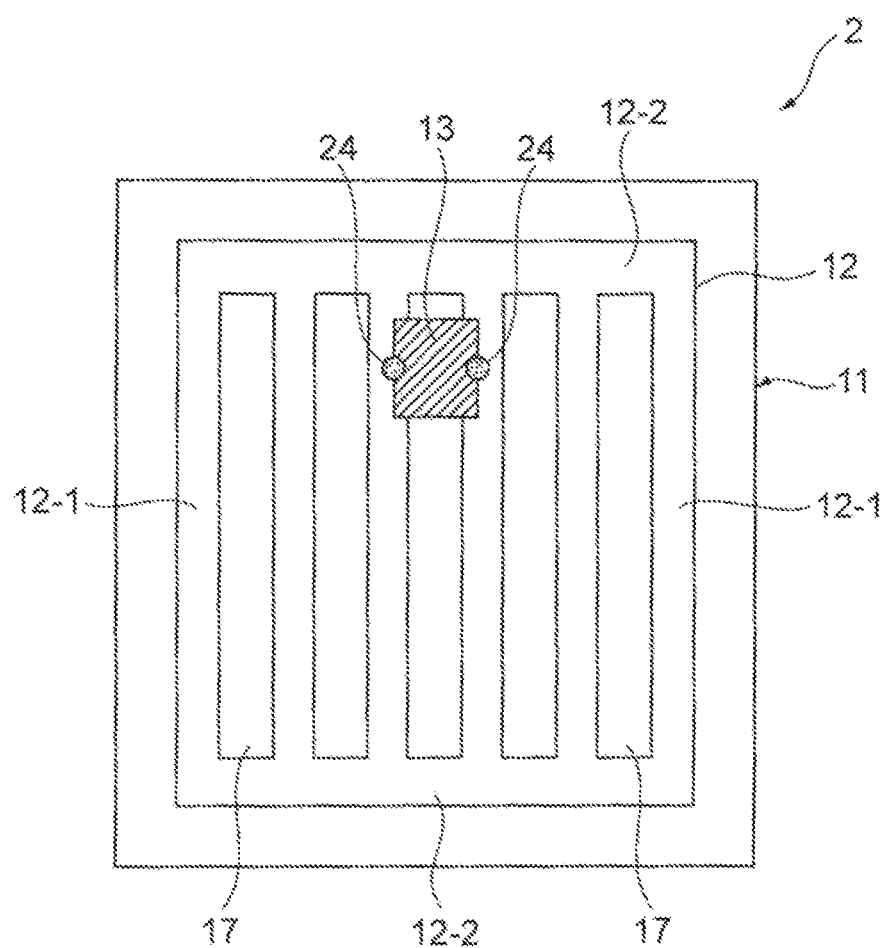
FIG. 2 is an explanatory view of the inside of a heat pipe according to a second embodiment of the present invention.

In the heat pipe 1 according to the first embodiment, the hydrogen absorbing metals 13 are welded to the inner surface of the planar container 11 thus being fixed to the planar container 11. However, in the heat pipe 2 according to the second embodiment, instead of adopting such a configuration, as shown in FIG. 2, a hydrogen absorbing metal 13 is welded to a front surface of a wick structure 12. Accordingly, the hydrogen absorbing metal 13 is fixed to the wick structure 12. Further, the hydrogen absorbing metal 13 is welded to the front surface of the wick structure 12 so that alloy portions 24 each of which contains a component of the hydrogen absorbing metal 13 and a component of the wick structure 12 are formed on the front surface of the wick structure 12 and a front surface of the hydrogen absorbing metal 13.

Further, in the heat pipe 2, the hydrogen absorbing metal 13 is arranged so as to extend between predetermined straight line portions 12-1 of the wick structure 12 which are disposed adjacently to each other. Portions of the hydrogen absorbing metal 13 which do not contribute to the formation of the alloy portions 24 are arranged between the predetermined straight line portions 12-1 disposed adjacently to each other, that is, in a vapor flow path 17. A portion where the hydrogen absorbing metal 13 is arranged and the number of hydrogen absorbing metals 13 arranged are not particularly limited. In the heat pipe 2, one hydrogen absorbing metal 13 is arranged at a peripheral edge portion of the planar container 11. Although not particularly limited, in the heat pipe 2, a welded portion of the hydrogen absorbing metal 13 is formed such that welding is performed at one portion on each of both edge portions of the hydrogen absorbing metal 13, that is, at a plurality of portions (two portions in total). Accordingly, in the heat pipe 2, the alloy portion 24 is formed at one portion on each of both edge portions of the hydrogen absorbing metal 13, that is, at the plurality of portions (two portions in total).

In the heat pipe 2, the alloy portions 24 are arranged on the front surface of the wick structure 12 and the front surface of the hydrogen absorbing metal 13. The portions of the hydrogen absorbing metal 13 which do not contribute to the formation of the alloy portions 24 are arranged in the vapor flow path 17. Accordingly, in this mode, both the alloy portions 24 and the portions of the hydrogen absorbing metal 13 which do not contribute to the formation of the alloy portions 24 are arranged in a state of being exposed to the cavity portion of the planar container 11. Therefore, both portions are brought into direct contact with a working fluid.

In the same manner as the heat pipe 1, also in the heat pipe 2, the hydrogen absorbing metal 13 can enhance a capacity for absorbing a non-condensable gas such as a hydrogen gas at 350° C. or below and, eventually, the heat pipe 2 can acquire excellent heat transfer characteristics.

Next, a heat pipe according to a third embodiment of the present invention is described with reference to drawings. Constitutional elements identical to the constitutional elements of the heat pipes according to the first and second embodiments are given the same reference characters, and the description is made using the same reference characters.

Figure 3A:
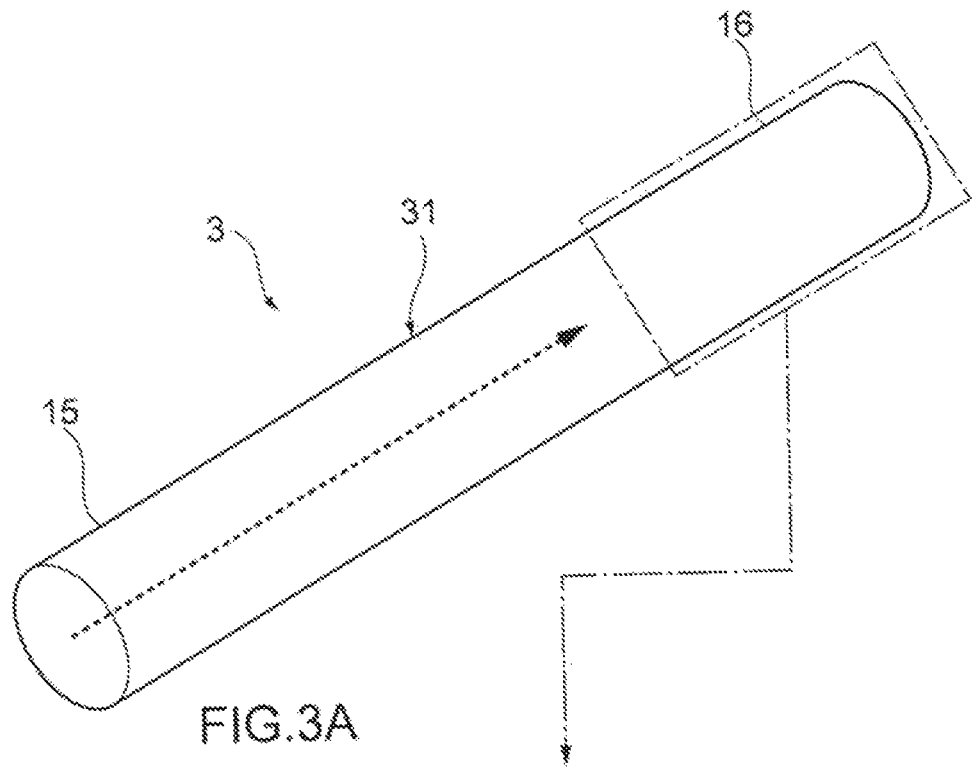
FIG. 3A is an external appearance view of a heat pipe according to a third embodiment of the present invention.
Figure 3B:
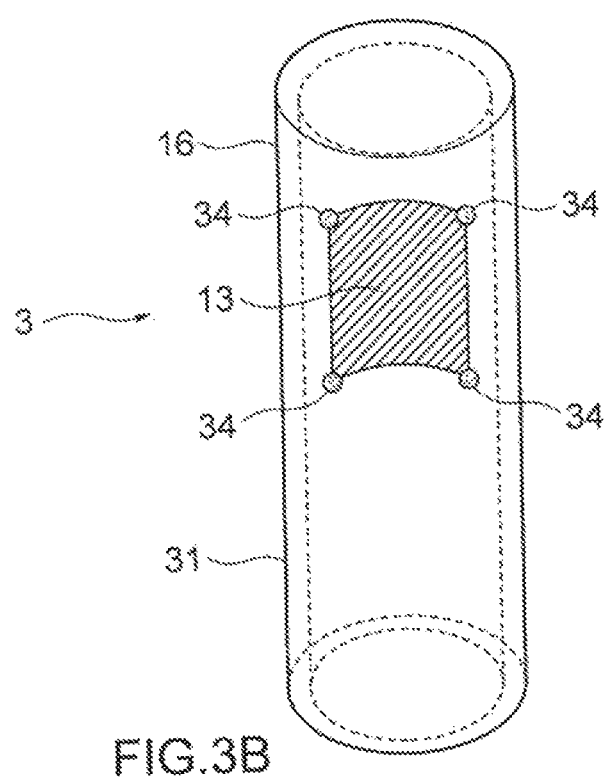
FIG. 3B is an explanatory view of the inside of the heat pipe according to the third embodiment of the present invention.

In the heat pipe 1 according to the first embodiment, the planar container 11 is used. However, in the heat pipe 3 according to the third embodiment, instead of adopting such a configuration, as shown in FIG. 3A, a round container 31 is used which is formed of a pipe member having a circular cross-sectional shape in the radial direction. A portion where a hydrogen absorbing metal 13 is arranged and the number of hydrogen absorbing metals 13 arranged are not particularly limited. As shown in FIG. 3B, in the heat pipe 3, one hydrogen absorbing metal 13 is arranged at a portion of a condensation portion 16 forming one end portion of the round container 31 in the longitudinal direction where a wick structure (not shown in the drawing) is not arranged. On the other hand, the hydrogen absorbing metal 13 is not arranged at an evaporation portion 15 forming another end portion of the round container 31 in the longitudinal direction.

The hydrogen absorbing metal 13 is welded to an inner surface of the round container 31 thus being fixed to the round container 31. Further, the hydrogen absorbing metal 13 is welded to the inner surface of the round container 31 so that alloy portions 34 each of which contains a component of the hydrogen absorbing metal 13 and a component of the round container 31 are formed on the inner surface of the round container 31 and an inner surface of the hydrogen absorbing metal 13. Although not particularly limited, in the heat pipe 3, a welded portion of the hydrogen absorbing metal 13 is formed at a plurality of portions (four portions in the drawing) in a peripheral edge portion of the hydrogen absorbing metal 13. Accordingly, in the heat pipe 3, the alloy portion 34 is formed at the plurality of portions (four portions in the drawing) in the peripheral edge portion of the hydrogen absorbing metal 13.

In the same manner as the heat pipe 1 which uses the planar container 11, also in the heat pipe 3 which uses the round container 31, the hydrogen absorbing metal 13 can enhance a capacity for absorbing a non-condensable gas such as a hydrogen gas at 350° C. or below and, eventually, the heat pipe 3 can acquire excellent heat transfer characteristics.

Next, heat pipes according to fourth and fifth embodiments of the present invention are described with reference to drawings. Constitutional elements identical to the constitutional elements of the heat pipes according to the first to third embodiments are given the same reference characters, and the description is made using the same reference characters.

Figure 4A:
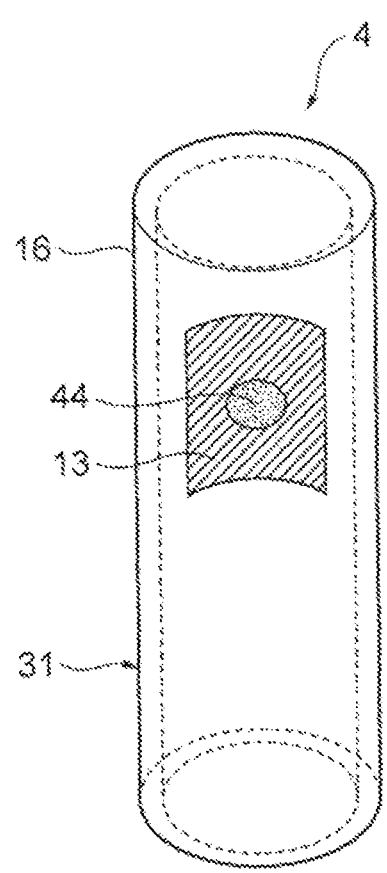
FIG. 4A is an explanatory view of the inside of a heat pipe according to a fourth embodiment of the present invention.

In the heat pipe 3 according to the third embodiment which uses the round container 31, the welded portion is formed at the plurality portions (four portions in the drawing) of in the peripheral edge portion of the hydrogen absorbing metal 13. However, in the heat pipe 4 according to the fourth embodiment, instead of adopting such a configuration, as shown in FIG. 4A, a welded portion is formed at one portion, that is, at a center portion, of the hydrogen absorbing metal 13. Accordingly, in the heat pipe 4, an alloy portion 44 is formed at one portion, that is, at the center portion, of the hydrogen absorbing metal 13.

Figure 4B:
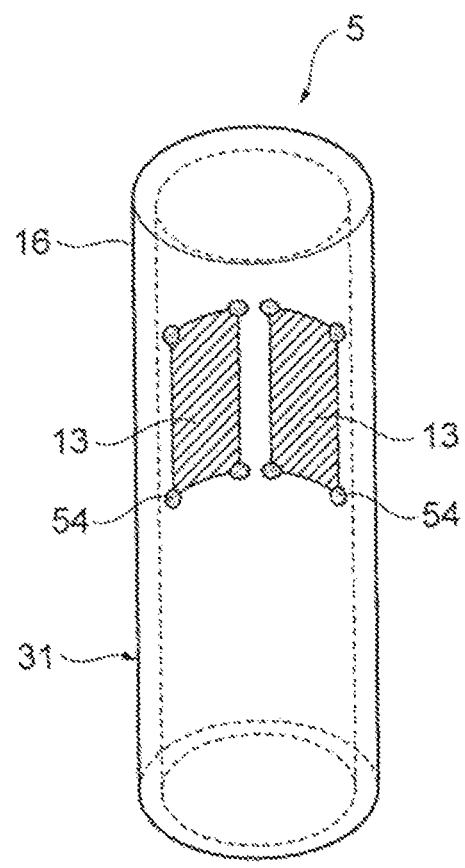
FIG. 4B is an explanatory view of the inside of a heat pipe according to a fifth embodiment of the present invention.

Further, in the heat pipe 3 according to the third embodiment which uses the round container 31, one hydrogen absorbing metal 13 is disposed at the condensation portion 16. However, in the heat pipe 5 according to the fifth embodiment, instead of adopting such a configuration, as shown in FIG. 4B, a plurality (two in the drawing) of hydrogen absorbing metals 13 are disposed at a condensation portion 16. In the heat pipe 5, a welded portion of the hydrogen absorbing metal 13 is formed at a plurality of portions (four portions in the drawing) in a peripheral edge portion of each hydrogen absorbing metal 13. Accordingly, in the heat pipe 5, an alloy portion 54 is formed at the plurality of portions (four portions in the drawing) in the peripheral edge portion of each hydrogen absorbing metal 13.

As described above, even when the round container 31 is used in place of the planar container 11, the number of hydrogen absorbing metals 13 arranged is not particularly limited. The number of welded portions (alloy portions 34, 44, 54) of each hydrogen absorbing metal 13 is also not particularly limited.

Next, another embodiment of the present invention is described. In the above-mentioned respective embodiments, the hydrogen absorbing metal is arranged at the condensation portion. However, instead of adopting such a configuration, the hydrogen absorbing metal may be arranged at a portion between the condensation portion and the evaporation portion or at the evaporation portion. The hydrogen absorbing metal may be arranged also at the portion between the condensation portion and the evaporation portion or at the evaporation portion in addition to the arrangement at the condensation portion. Further, in the above-mentioned third to fifth embodiments, the hydrogen absorbing metal is welded to the inner surface of the round container. However, instead of adopting such a configuration, the hydrogen absorbing metal may be welded to the wick structure disposed in the cavity portion of the round container. Further, each of the round containers in the above-mentioned third to fifth embodiments may be formed into a flat container by applying flat processing when necessary.

Further, in the above-mentioned respective embodiments, the metal which absorbs hydrogen at 350° C. or below and releases no hydrogen at 350° C. or below (hydrogen absorbing metals) is welded to the container or to the wick structure thus forming the alloy portion. However, instead of adopting such a configuration, the hydrogen absorbing metal may be welded to neither of the container nor the wick structure. Accordingly, neither of the alloy portion which contains a component of the hydrogen absorbing metal and a component of the container nor the alloy portion which contains a component of the hydrogen absorbing metal and a component of the wick structure may be formed.

In a mode where the hydrogen absorbing metal is welded to neither of the container nor the wick structure, a method for fixing the hydrogen absorbing metal to the cavity portion is not particularly limited. For example, methods can be named such as a method where the hydrogen absorbing metal is sandwiched between straight line portions of the wick structure having a ladder shape or a method where the hydrogen absorbing metal is sandwiched between a planar portion of the planar container on the front surface side and a planar portion of the planar container on the back surface side.

Also in the above-mentioned mode where the alloy portion is not formed, the hydrogen absorbing metal is disposed in the cavity portion so that the hydrogen absorbing metal can absorb a non-condensable gas such as a hydrogen gas in the cavity portion. Accordingly, it is possible to acquire a heat pipe which exhibits excellent heat transfer characteristics for a long period of time. Further, even if the heat pipe is manufactured through a step of processing such as soldering or welding in a step of manufacturing the heat pipe, it is possible to acquire the heat pipe having excellent heat transfer characteristics.

Next, an example of a method for using a heat pipe according to the present invention is described. The method for using a heat pipe according to the present invention is not particularly limited. For example, use methods can be named such as a use method where a heating element is thermally connected to a portion of the heat pipe at a desired position, the portion at the position forms an evaporation portion, a heat exchange means such as a heat radiating fin or a heat sink is thermally connected to a portion of the heat pipe at a desired position different from the evaporation portion, the portion at the position forms a condensation portion, and heat of the heating element is transferred to the heat exchange means, or a use method where the heat pipe of the present invention is provided to a heat sink which includes a heat receiving plate and a heat radiating fin, and heat is transferred from the heat receiving plate to the heat radiating fin of the heat sink by the heat pipe of the present invention.

Example

Hereinafter, examples of the present invention are described. However, the present invention is not limited to the following examples.

Structure of Heat Pipe of Example 1

Figure 5:
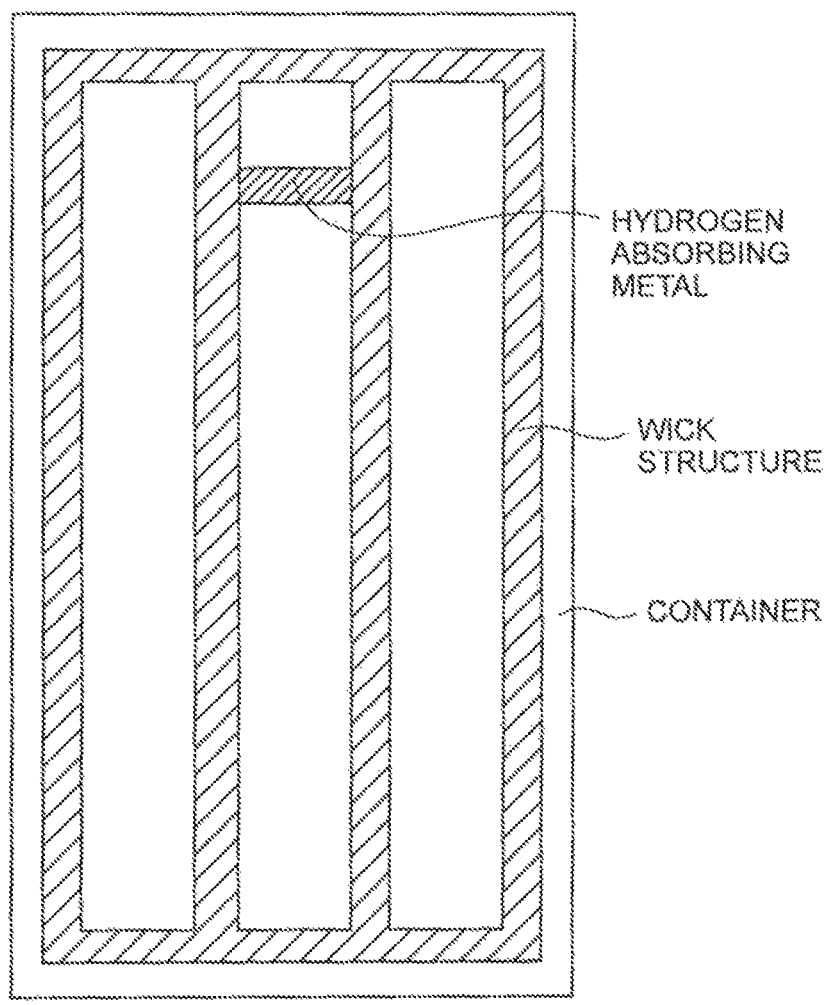
FIG. 5 is an explanatory view of the internal structure of a heat pipe used in an example 1.

A container having a cavity portion forming an inner space was prepared using two plate members made of stainless steel which opposedly face each other. A wick structure and a metal which absorbs hydrogen at 350° C. or below and releases no hydrogen at 350° C. or below (hydrogen absorbing metal) were arranged in the cavity portion of the container, and a working fluid was sealed in the cavity portion of the container. A heat pipe was formed into a heat pipe of a planar type where a width is 50 mm, a length is 100 mm, and a thickness is 0.4 mm (a height of the cavity portion being 0.2 mm) (50 mm×100 mm×0.4 mm). A mesh made of stainless steel was used as the wick structure. One titanium alloy (having a width of 4 mm, a length of 1 mm, and a thickness of 0.1 mm (4 mm×1 mm×0.1 mm)) was disposed in the cavity portion as a hydrogen absorbing metal. Further, the hydrogen absorbing metal was positioned at one end portion of the planar heat pipe in the longitudinal direction, and is fixed in a state of being sandwiched by the mesh forming the wick structure. Water was used as a working fluid. FIG. 5 shows the specific structure of the planar heat pipe of the example 1.

Structure of Heat Pipe of Example 2

Figure 6:
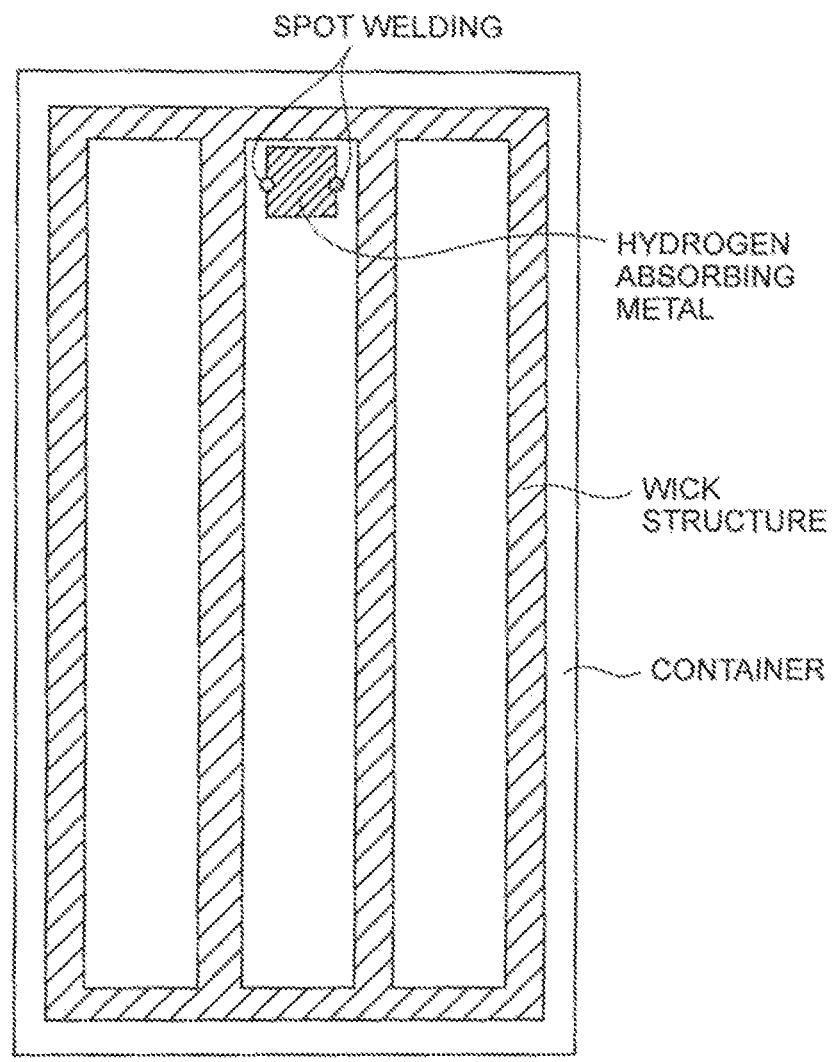
FIG. 6 is an explanatory view of the internal structure of a heat pipe used in an example 2.

A container having a cavity portion forming an inner space was prepared using two plate members made of stainless steel which opposedly face each other. A wick structure and a metal which absorbs hydrogen at 350° C. or below and releases no hydrogen at 350° C. or below (hydrogen absorbing metals) were arranged in the cavity portion of the container. A mass of the metal is equal to the mass of the metal in the example 1. A working fluid was sealed in the cavity portion of the container. A heat pipe was formed into a heat pipe of a planar type where a width is 50 mm, a length is 100 mm, and a thickness is 0.4 mm (a height of the cavity portion being 0.2 mm) (50 mm×100 mm×0.4 mm). A mesh made of stainless steel was used as the wick structure. One titanium alloy (having a width of 2 mm, a length of 2 mm, and a thickness of 0.1 mm) (2 mm×2 mm×0.1 mm) was disposed in the cavity portion as a hydrogen absorbing metal. Spot welding was performed at two portions such that 5 mass % of the titanium alloy forms alloy portions in cooperation with the plate member of the container which is made of stainless steel. Accordingly, the hydrogen absorbing metal was fixed to an inner surface of the container by spot welding. Further, the hydrogen absorbing metal was positioned at one end portion of the planar heat pipe in the longitudinal direction. Water was used as a working fluid. FIG. 6 shows the specific structure of the planar heat pipe of the example 2.

Elemental Analysis of Alloy Portion

An elemental analysis was performed on the heat pipe of the example 2 by an electron probe micro analyzer (EPMA) (JXA-8800RL (type of model) made by JEOL Ltd.) in a state where an acceleration voltage is 15.0 kV, an irradiation current is 5.018E-08A, analyzing crystals LDE1, TAP, PETH, LIF are used, and a magnification is 1500 times. As a result, Cr, Fe, and Ni were detected from the container. Ti was detected from a titanium alloy forming the hydrogen absorbing metal. Ti, Cr, Fe, and Ni were detected from a welding mark formed by spot welding. Fe of the container and Ti of a titanium alloy were detected from the welding mark. Accordingly, it was confirmed that the alloy portion is formed where the container and the hydrogen absorbing metal are melted thus integrally formed with each other.

Structure of Heat Pipe of Comparison Example

A heat pipe of the comparison example was prepared which has the structure substantially equal to the structure of the planar heat pipe of the above-mentioned example 1 except for that no hydrogen absorbing metal is disposed.

Evaluation Items (1) Amount of Generated Hydrogen Gas

The heat pipe was continuously operated at an operation temperature of 100° C., and an amount of generated hydrogen gas was measured for every elapsed time. The amount of generated hydrogen gas (number of moles) was specified as follows. A partial pressure of hydrogen gas was calculated from a difference between a saturated water vapor pressure at a surface temperature (T1) which is described later and a saturated water vapor pressure at a surface temperature (T2) which is described later. Assuming that a hydrogen gas stagnates in a space ranging from a portion where the surface temperature (T2) is measured to an end surface of one end portion of the planar heat pipe in the longitudinal direction, a volume of the hydrogen gas was calculated. Based on the above-mentioned calculation result, the amount of generated hydrogen gas (number of moles) was specified using a state equation of ideal gas.

(2) Temperature Difference in the Inside of Heat Pipe

The heat pipe was continuously operated at an operation temperature of 100° C., and a temperature difference in the inside of the heat pipe was measured for every elapsed time. A temperature difference in the inside of the heat pipe was calculated as follows. A region of the planar heat pipe from another end portion of the planar heat pipe in the longitudinal direction to a 30% portion was immersed in a water bath at 50° C. The surface temperature (T1) at a center portion of the portion of the planar heat pipe immersed in the water bath and the surface temperature (T2) at a 10% portion (which is not immersed in the water bath) from one end portion of the planar heat pipe in the longitudinal direction were obtained. The temperature difference was calculated from a difference between the surface temperature (T1) and the surface temperature (T2) ($\Delta T = T1 - T2$).

When a hydrogen gas (non-condensable gas) is present in the inner space of the heat pipe, a hydrogen gas stagnates at one end portion of the heat pipe which is not immersed in the water bath so that the one end portion is less likely to function as the heat pipe whereby a difference $\Delta T$ increases. Accordingly, a smaller difference $\Delta T$ means that less hydrogen gas is present in the inner space of the heat pipe.

Result

Figure 7A:
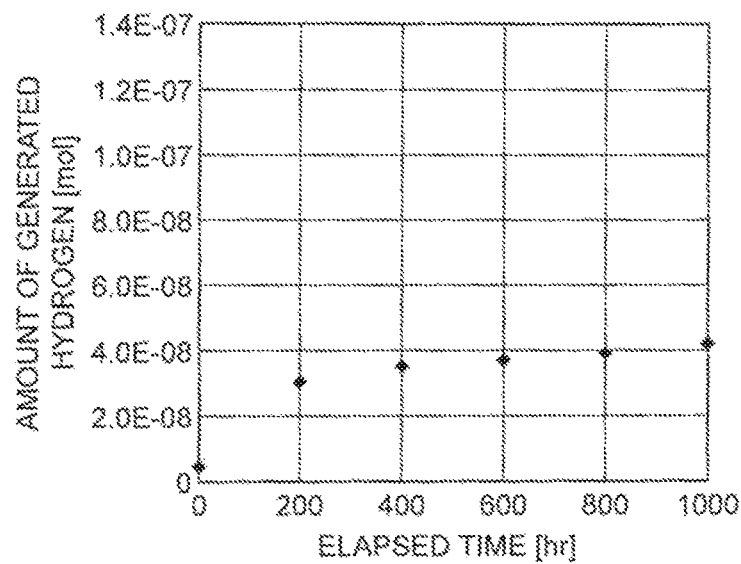
FIG. 7A is a graph showing the result of an amount of generated hydrogen gas in the example 1.
Figure 7B:
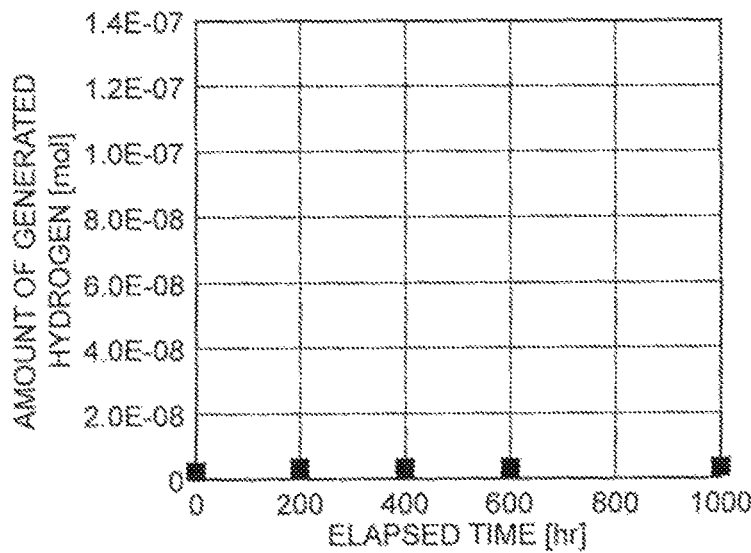
FIG. 7B is a graph showing the result of an amount of generated hydrogen gas in the example 2.
Figure 7C:
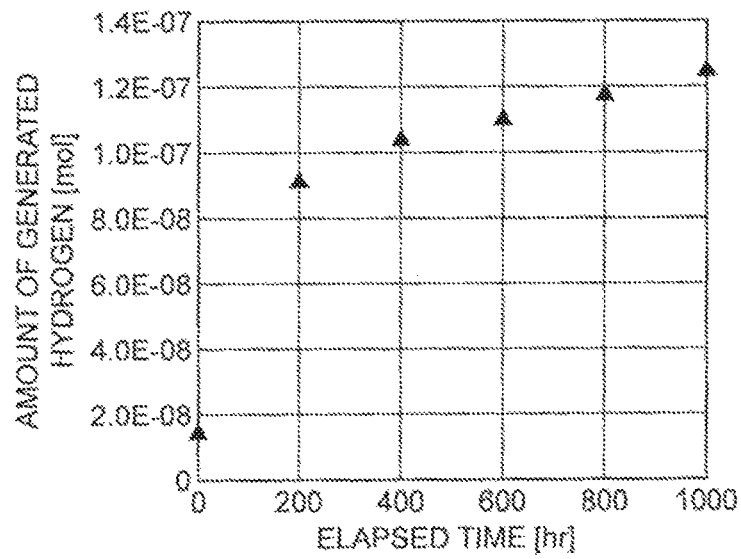
FIG. 7C is a graph showing the result of an amount of generated hydrogen gas in a comparison example.

The result of an amount of generated hydrogen gas is shown in FIG. 7, and the result of a temperature difference in the heat pipe is shown in FIG. 8. As shown in FIG. 7A and FIG. 7B, in the examples 1, 2 where the hydrogen absorbing metal is disposed in the cavity portion, at a point of time where a continuous operation time is 1000 hours, an amount of generated hydrogen gas was approximately 8 times and approximately 1 time as large as an amount of generated hydrogen gas at a point of time where a continuous operation time is 0 hours. Even after 1000 hours from the start of operation, the generation of hydrogen gas was suppressed. Particularly, as shown in FIG. 7B, in the example 2 where the hydrogen absorbing metal is welded to the inner surface of the container, at a point of time where a continuous operation time is 1000 hours, an amount of generated hydrogen gas was substantially equal to an amount of generated hydrogen gas at a point of time where a continuous operation time is 0 hours. Even after 1000 hours from the start of operation, the generation of hydrogen gas was further suppressed. Further, as shown in FIG. 7A and FIG. 7C, in the example 1, at a point of time 1000 hours elapsed from the start of operation, the amount of generated hydrogen gas was suppressed to approximately ⅓ of the amount of generated hydrogen gas in the comparison example. On the other hand, as shown in FIG. 7C, in the comparison example where no hydrogen absorbing metal is disposed in the cavity portion, at a point of time where a continuous operation time is 1000 hours, an amount of generated hydrogen gas was approximately ten times as large as an amount of generated hydrogen gas at a point of time where a continuous operation time is 0 hours. The amount of generated hydrogen gas increased corresponding to an increase in operation time. Accordingly, by disposing the hydrogen absorbing metal in the cavity portion, an amount of hydrogen gas present in the inner space of the heat pipe can be reduced.

Figure 8A:
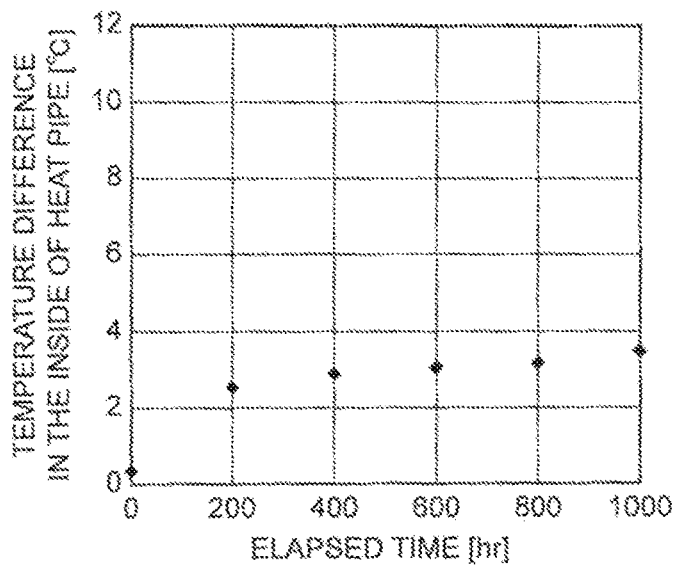
FIG. 8A is a graph showing the result of a temperature difference in the heat pipe of the example 1.
Figure 8B:
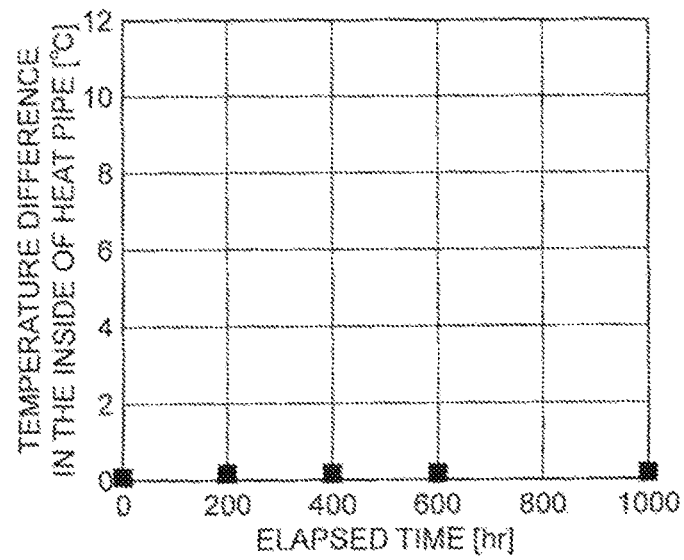
FIG. 8B is a graph showing the result of a temperature difference in the heat pipe of the example 2.
Figure 8C:
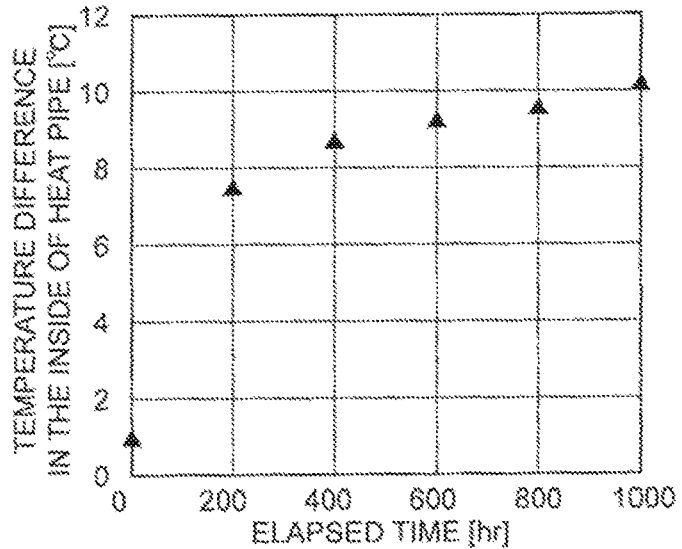
FIG. 8C is a graph showing the result of a temperature difference in a heat pipe of the comparison example.

Further, as shown in FIG. 8A, in the example 1 where the hydrogen absorbing metal is disposed in the cavity portion, a difference $\Delta T$ at a point of time where a continuous operation time is 1000 hours was a value just larger than a difference $\Delta T$ at a point of time where a continuous operation time is 0 hours by approximately 3° C. As shown in FIG. 8B, in the example 2 where the hydrogen absorbing metal is welded to the inner surface of the container, a difference $\Delta T$ at a point of time where a continuous operation time is 1000 hours was substantially equal to a difference $\Delta T$ at a point of time where a continuous operation time is 0 hours. Accordingly, in the examples 1, 2, particularly in the example 2, even after 1000 hours from the start of operation, a difference $\Delta T$ was suppressed. On the other hand, as shown in FIG. 8C, in the comparison example where no hydrogen absorbing metal is disposed in the cavity portion, a difference $\Delta T$ at a point of time where a continuous operation time is 1000 hours was larger than a difference $\Delta T$ at a point of time where a continuous operation time is 0 hours by approximately 9° C. The difference $\Delta T$ increased corresponding to an increase in operation time. Accordingly, also from a viewpoint of a temperature difference in the inside of the heat pipe, it was confirmed that, by disposing the hydrogen absorbing metal in the cavity portion, the hydrogen absorbing metal can enhance a capacity for absorbing a hydrogen gas so that an amount of hydrogen gas present in the inner space of the heat pipe can be reduced.

Black coating having an emissivity $\varepsilon$ of 0.95 ($\varepsilon = 0.95$) was applied to entire one front surface of each of the above-mentioned heat pipes of the examples 1, 2, and the comparison example which are continuously operated for 1000 hours. Thereafter, a region of each heat pipe ranging from another end portion of the heat pipe in the longitudinal direction to the 30% portion was immersed in a water bath at 50° C. When each heat pipe was observed by infrared thermography (FLIR T600), the heat pipe was divided into a region where a working fluid in the heat pipe acts thus increasing a temperature and a region where a gas is generated thus maintaining a low temperature. A ratio of an area of a region which maintains a low temperature with respect to the entire area was obtained. In the example 1, the area of the region was 4.3%. In the example 2, the area of the region was 1.5%. In the comparison example, the area of the region was 20.1%. From these results, it was confirmed that, in the example 1 and the example 2, after the heat pipe is operated continuously for 1000 hours, an amount of hydrogen gas in the cavity portion is 10 volume % or less of an entire amount of gas when the heat pipe is operated at 50° C.

INDUSTRIAL APPLICABILITY

The heat pipe of the present invention has an excellent capacity for absorbing a non-condensable gas such as a hydrogen gas so that the heat pipe exhibits excellent heat transfer characteristics. Accordingly, the heat pipe is applicable in a wide range of fields including cooling of an electronic component, or an internal combustion engine and a battery mounted on a vehicle.

LIST OF REFERENCE SIGNS 1, 2, 3, 4, 5 heat pipe
11, 31 container
12 wick structure
13 hydrogen absorbing metal
14, 24, 34, 44, 54 alloy portion

The invention claimed is:

1. A heat pipe comprising: a container having a cavity portion inside the container; a wick structure disposed in the cavity portion; a working fluid sealed in the cavity portion; and a metal which absorbs hydrogen at 350° C. or below and releases no hydrogen at 350° C. or below, the metal being disposed in the cavity portion,
   wherein the metal is fixed to the container or the wick structure by welding, and an alloy portion is formed between the metal and the container or between the metal and the wick structure.

2. The heat pipe according to claim 1, wherein a material for forming the container is copper, a copper alloy, iron, an iron alloy, stainless steel, aluminum, an aluminum alloy, nickel, or a nickel alloy.

3. The heat pipe according to claim 1, wherein a material for forming the container is stainless steel.

4. The heat pipe according to claim 1, wherein the metal is a titanium-based alloy, a palladium-based alloy, a vanadium-based alloy, a calcium-based alloy or a composite alloy of the titanium-based alloy, the palladium-based alloy, the vanadium-based alloy, and the calcium-based alloy.

5. The heat pipe according to claim 1, herein the metal is a titanium-based alloy.

6. The heat pipe according to claim 1, wherein the metal s arranged at a portion where the working fluid is condensed.

7. The heat pipe according to claim 1, wherein the alloy portion contains any of iron, nickel, chromium or the metal.

8. The heat pipe according to claim 1, wherein the alloy portion is formed of 2 mass % to 50 mass % of the metal.

9. The heat pipe according to claim 1, wherein an amount of hydrogen gas in the cavity portion is 10 volume/0 or less of an entire amount of gas in the cavity portion at an operation temperature of 50° C.

* * * * *